US006542399B2

(12) United States Patent
Ricodeau

(10) Patent No.: US 6,542,399 B2
(45) Date of Patent: Apr. 1, 2003

(54) APPARATUS AND METHOD FOR PUMPING MEMORY CELLS IN A MEMORY

(75) Inventor: Francois Pierre Ricodeau, Coppell, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/894,262

(22) Filed: Jun. 28, 2001

(65) Prior Publication Data

US 2003/0002319 A1 Jan. 2, 2003

(51) Int. Cl.[7] .............................................. G11C 11/24
(52) U.S. Cl. ................................. 365/149; 365/189.116
(58) Field of Search ........................... 365/149, 189.11, 365/203, 185.23, 145, 190

(56) References Cited

U.S. PATENT DOCUMENTS

| 4,769,784 | A | | 9/1988 | Doluca et al. ............... 365/149 |
|---|---|---|---|---|
| 5,255,232 | A | | 10/1993 | Foss et al. ................... 365/203 |
| 5,303,183 | A | * | 4/1994 | Asakura ...................... 365/149 |
| 5,414,656 | A | | 5/1995 | Kenney ....................... 365/149 |
| 5,508,962 | A | | 4/1996 | McLaughlin et al. .. 365/189.09 |
| 5,734,603 | A | | 3/1998 | Tai .............................. 365/149 |
| 6,081,459 | A | | 6/2000 | Kim ....................... 365/189.09 |
| 6,147,896 | A | * | 11/2000 | Kim et al. ................... 365/145 |
| 6,236,598 | B1 | | 5/2001 | Chou .................... 365/189.06 |

OTHER PUBLICATIONS

Kazuyasu Fujishima, et al., "A Storage–Node Boosted RAM with Word–Line Delay Compensation", IEEE Journal of Solid–State Circuits, vol. SC–17, No. 5, Oct. 1982, pp. 872–876.

Mikio Asakura, Kazutami Arimoto, "Cell–Plate Line Connecting Complementary Bit–Line (C3) Architecture for Battery–Operating DRAM's", IEEE Journal of Solid–State Circuits, vol. 27, No. 4, Apr. 1992, pp. 597–602.

* cited by examiner

Primary Examiner—Tan T. Nguyen
(74) Attorney, Agent, or Firm—Lisa K. Jorgenson; William A. Munck

(57) ABSTRACT

An apparatus (and method) is provided that pumps (up or down) the voltage on a memory cell thereby increasing (above the logic one voltage value) or decreasing (below the logic zero voltage value) the voltage stored in the memory cell, and providing an increased differential on the bit lines during a subsequent read operation of the memory cell. When a logic one or zero voltage is coupled to the first plate of the memory cell for storage, the second plate is held at a voltage that is lower or higher, respectively (preferably a voltage that is the complement logic value of the value being stored). After the word line is deactivated (thereby decoupling the memory cell from the bit line and storing a logic one voltage value or logic zero voltage value), the voltage on the second plate is correspondently either raised or lowered. In the present invention, the second plate is raised or lowered to the precharge and equilibrate value (usually Vdd/2). This pumps the voltage stored in the memory cell to a higher voltage (if a logic one is stored) or a lower voltage (if a logic zero is stored).

23 Claims, 4 Drawing Sheets

APPARATUS AND METHOD FOR PUMPING MEMORY CELLS IN A MEMORY

TECHNICAL FIELD

The present invention relates to memory and, in particular, to an apparatus and method for pumping memory cells in a memory.

BACKGROUND

In dynamic random access memories (DRAM), densities are increasing and operating voltages are decreasing. In addition, DRAMs are now being embedded with other logic and functionality on a single integrated circuit (IC). The technological drive toward higher densities, lower operating voltages and embeddedness for DRAMs are all contributing to a decreasing differential signal voltage (related to noise margin) detected on the bit lines during the read operation of a memory cell.

One apparatus and method of pumping memory cells is described in U.S. application Ser. No. 09/751,367 having a filing date of Dec. 29, 2000 and is incorporated herein by reference.

Accordingly, there exists a need for a method and apparatus for increasing the differential signal voltage detected during a read operation on the bit lines of a memory without the need for additional complex circuitry.

SUMMARY OF THE INVENTION

According to the present invention, there is provided a memory having a first bit line and a second bit line, with each bit line having a charge-storing element having a first plate and a second plate coupled thereto through an access device controlled by a respective word line. A voltage driver circuit, having a first output terminal coupled to the second plates of the first and second charge-storing elements, provides a high logic level voltage to the second plate of the first charge-storing element when a low logic level is present on the first bit line, a low logic level voltage to the second plate of the first charge-storing element when a high logic level voltage is present on the first bit line, and substantially the same voltage as an intermediate voltage to the second plate of the first charge-storing element when the intermediate voltage level is present on the first bit line.

In another embodiment of the present invention, there is provided a memory having a first bit line (true), a first charge-storing element having a first plate and a second plate, and a first access device having a first end, a second end and a control terminal, with the first end coupled to the first bit line, the second end coupled to the first plate of the first charge-storing element and defining a first node, and the control terminal coupled to a first word line. The memory also includes a second bit line (complement), a second charge-storing element having a first plate and a second plate, and a second access device with the first end, a second end and a control terminal, the first end coupled to the second bit line, the second end coupled to the first plate of the second charge-storing element and defining a second node, and the control terminal coupled to a second word line. A voltage driver circuit, having a first input terminal and an output terminal coupled to the second plates of the first and second charge-storing elements, applies a first voltage to the second plates when either one of the first or second access devices is activated and a second voltage is applied to the respective node, and also applies a third voltage to the second plates after the respective activated access device is deactivated.

In another embodiment of the present invention, there is provided a method of pumping a memory by activating a first word line for coupling a first plate of a first memory cell to a first bit line, activating a sense amplifier coupled to the first bit line and a second bit line for detecting a voltage differential between the first bit line and the second bit line, applying a high logic voltage value to the first bit line and a low logic voltage value to the second bit line, applying a first voltage to a second plate of the first memory cell and a second plate of a second memory cell, the second memory cell associated with the second bit line deactivating the first word line for decoupling the first plate of the first memory cell from the first bit line, and after the step of deactivating the first word line, applying a second voltage to the second plates of the first and second memory cells wherein the second voltage is greater than the first voltage.

In yet another embodiment of the present invention, there is provided a method of pumping a memory by precharging and equilibrating a first bit line (true) and a second bit line (complement) to an intermediate voltage, the intermediate voltage having a magnitude between a first voltage and a second voltage representing a logic high and a logic low, respectively, activating a first word line for coupling a first plate of a first memory cell to the first bit line, activating a sense amplifier coupled to the first bit line and the second bit line, applying the first voltage to the first bit line and the second voltage to the second bit line, applying the second voltage to a second plate of the first memory cell and a second plate of a second memory cell, the second memory cell associated with the second bit line and a second word line, deactivating the first word line for decoupling the first plate of the first memory cell from the first bit line, and after the step of deactivating the first word line, applying a third voltage to the second plates of the first and second memory cells, wherein the third voltage is substantially equal to the intermediate voltage.

BRIEF DESCRIPTION OF THE DRAWINGS

For a more complete understanding of the present invention, and the advantages thereof, reference is made to the following description taken in conjunction with the accompanying drawings, wherein.

DETAILED DESCRIPTION OF THE INVENTION

Figure 1:
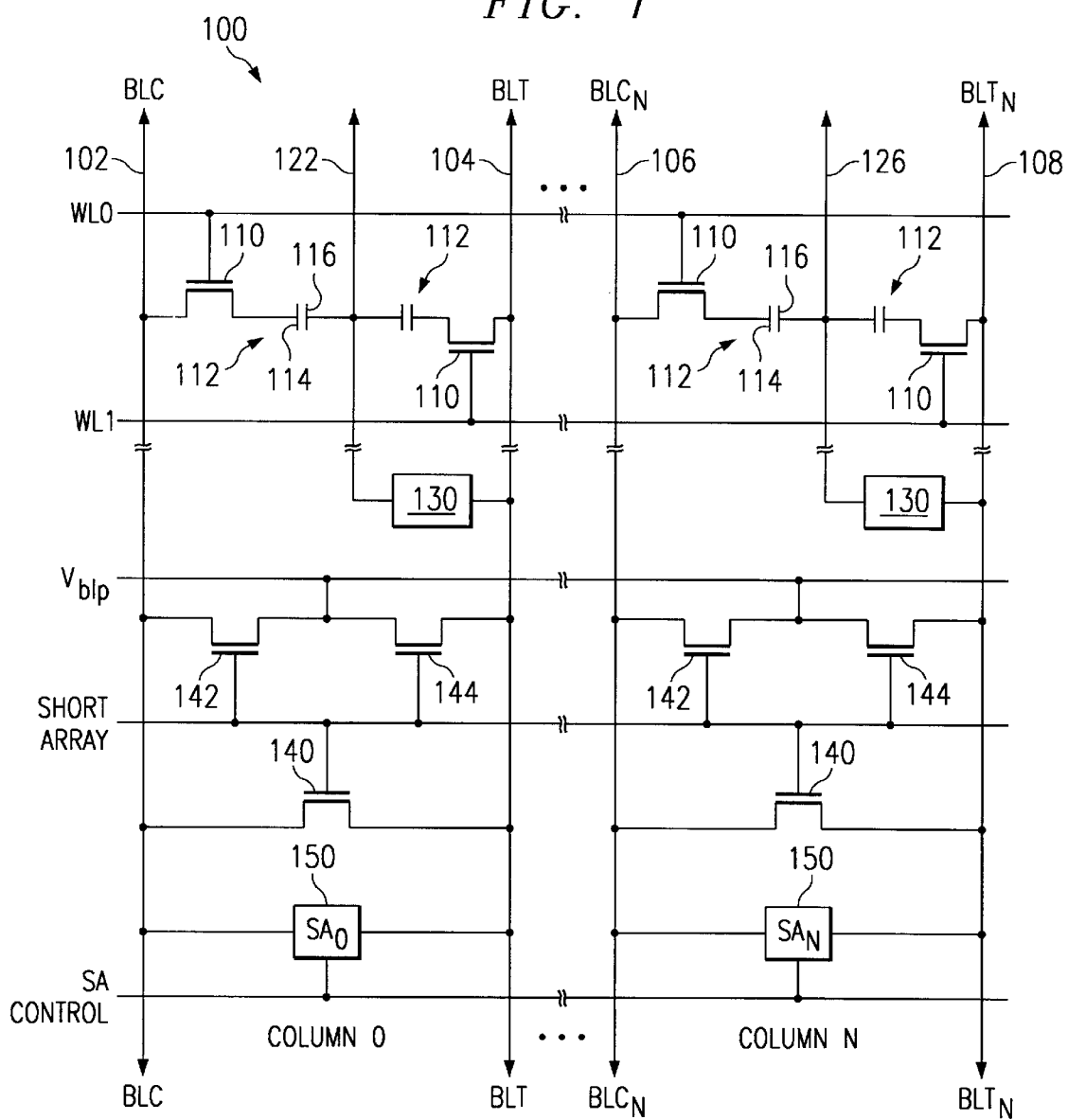
FIG. 1 is detailed diagram illustrating a memory array according to the present invention.

With reference to the drawings, like reference characters designate like or similar elements throughout the drawings.

Now referring to FIG. 1, there is shown a detailed diagram illustrating a memory array 100 in accordance with the present invention. The memory array 100 includes a plurality of memory cells arranged in rows and columns, with each row corresponding to a word line (0 thru N) and each column (0 thru N) corresponding to two bit lines (a bit line true (BLT) and a bit line complement (BLC)). Column 0 actually includes two sets of memory cells, with one set of memory cells associated with BLC 102 and one set of memory cells associated with BLT 104. And column N includes two sets of memory cells, with one set of memory cells associated with BLCN 106 and one set with BLTN 108. With each memory cell is associated an access device or transistor 110 for coupling the memory cell to the respective bit line (BLC or BLT). Each memory cell comprises a capacitor or charge-storing device 112 (or element) having a first plate 114 and a second plate 116, with a node coupling the first plate 114 to a S/D region of the access transistor 110. The access transistors 110 are controlled by the respective word lines (WL0, WL1, etc.).

In each column, the second plate of the capacitors (of the memory cells) is coupled to a cell plate line. In FIG. 1, the set of memory cells associated with BLC 102 and BLT 104 have their second plates 116 coupled to a cell plate line 122. Similarly, the set of memory cells associated with BLCN 106 and BLTN 108 have their second plates 116 coupled to a cell plate line 126.

Also in FIG. 1 is shown bit line equilibrate and precharge circuitry (transistors 140, 142 and 144) coupled to a voltage reference source Vblp for precharging the bit lines to a reference voltage. A control signal, identified as SHORT ARRAY, provides the control mechanism for equilibrating and precharging the bit lines to the voltage Vblp. Also shown for each column 0 thru N are sense amplifiers 150 controlled by a signal SA.

For each set of memory cells associated with a respective pair of complement bit lines (i.e., BLC and BLT of the column), a voltage driver circuit 130 provides a voltage source for each cell plate line connected to a set of memory cells (two sets of memory cells in each column with one set each associated with BLC and BLT; and a single cell plate line for both sets). As will be described further, and in accordance with the figures herein, the voltage driver circuit 130 provides a high logic level voltage (approximately Vdd) to the second plate 116 of the capacitor element 112 when a low logic level voltage (approximately Vss or ground) is present on the bit line (BLT or BLC), and a low logic level voltage to the second plate 116 of the capacitor element 112 when a high logic level voltage is present on the bit line (BLC or BLT). Further, the voltage driver circuit 130 provides substantially the same voltage as an intermediate voltage (e.g., approximately Vblp or Vdd/2) to the second plate 116 of the capacitor element 112 when the intermediate voltage level is present on the bit line (BLT or BLC).

Figure 2:
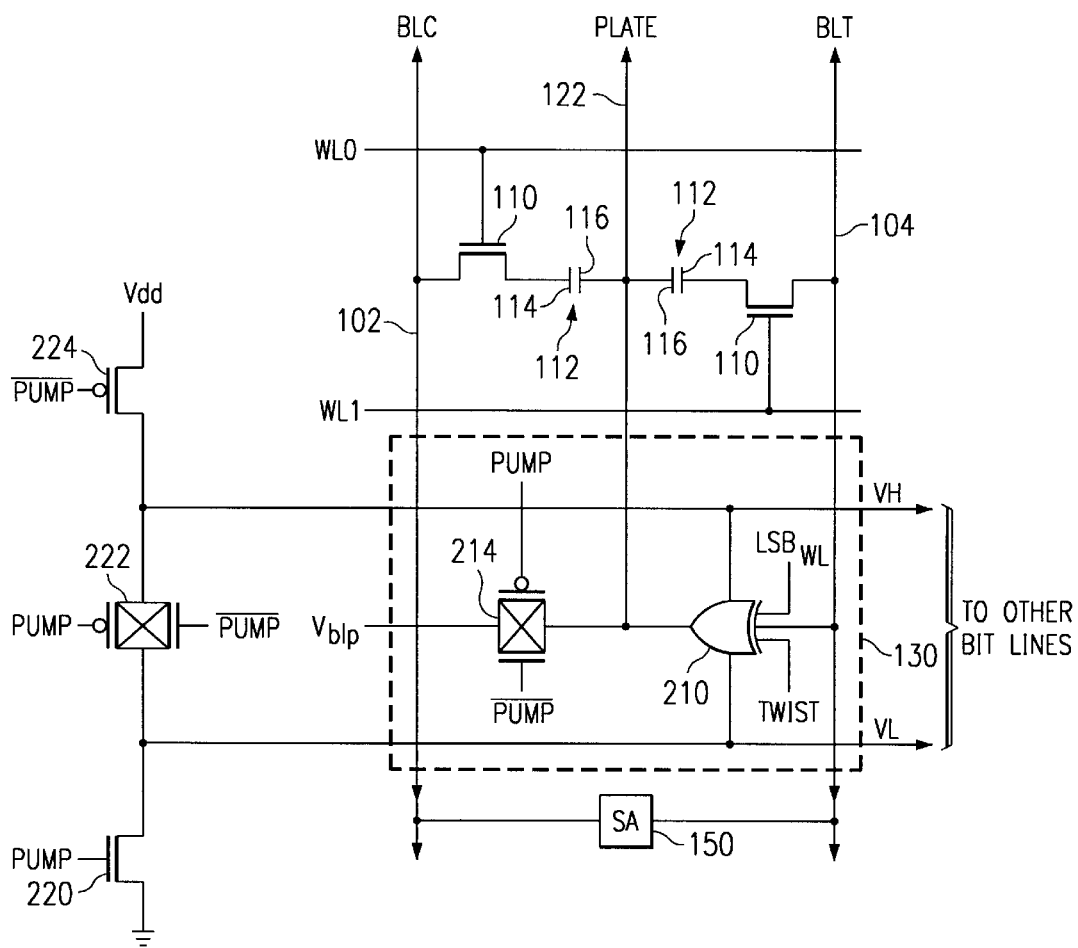
FIG. 2 illustrates the voltage driver circuit 130 shown in FIG. 1.

Now referring to FIG. 2, there is the voltage driver circuit 130 in accordance with the present invention. FIG. 2 preferably describes another embodiment where the voltage driver circuit 130 couples the bit line BLT 104 to the cell plate line 122 of the associated memory cells (all memory cells associated with BLC 102 and BLT 104). The voltage driver circuit 130 includes a three-input XOR logic gate 210, with one input connected to BLT 104, one input connected to a signal LSBWL, one input connected to a signal TWIST, and the output connected to the cell plate line 122. The XOR gate 210 is also connected to a line VL and a line VH. As will be appreciated, the line VH and VL provide a mechanism to turn-off operation of the XOR gate 210. When the voltage on VH and VL are approximately equal, no current flows and the XOR gate 210 is inoperative.

The voltage levels on the lines VH and VL are set by operation of an n-channel transistor 220, a transmission gate 222, and a p-channel transistor 224, as shown. A signal PUMP provides a control signal for determining the voltage on the lines VH and VL, and further provides control of another transmission gate 214 (part of the voltage driver circuit 130) coupling/decoupling the reference voltage Vblp to the cell plate line 122. In operation, when the PUMP signal is active, VH is high and VL is low, thereby providing power to the XOR gate 210 and decoupling Vblp from the cell plate line 122. When the PUMP signal is inactive, the transistors 220, 224 are turned off and the lines VH and VL are shorted together resulting in a voltage of approximately Vdd/2 on lines VH and VL essentially turning off the XOR gate 210. In addition, the transmission gate 214 couples Vblp to the cell plate line 122.

As shown in FIG. 2, due to the memory cells associated with both bit lines in a column connected to a cell plate line (in FIG. 2, cell plate line 122), the XOR gate includes the input signal LSBWL. The input signal LSBWL corresponds to the least significant bit in the memory address (i.e., for even word lines, signal LSBWL has a predetermined logic level, and for odd word lines, signal LSBWL has the complement logic level) and assists in identifying the particular memory cell bit line (BLT or BLC) from which the "true" data is read/written. In other words, when memory cells associated with BLT 104 are read/written, the voltage driver circuit 130 applies, an inverse (or complement) logic level voltage of the logic voltage level present on BLT 104 (the data read or written to the memory cell associated with BLT 104) to the cell plate line 122 (BLT 104=high, cell plate line 122=low, and vice versa). In contrast, when memory cells associated with BLC 102 are read/written, the voltage driver circuit 130 applies the same logic level voltage as the logic voltage level present on BLT 104 (the logic complement of the data read or written to the memory cell associated with BLC 102) to the cell plate line 122 (BLT 104=high, cell plate line 122=low, and vice versa). This function is accomplished using the signal LSBWL.

Also shown as an input to the XOR gate 210 is the input signal TWIST. When nontwisted bit lines are utilized, the TWIST signal is not necessary and the XOR gate 210 may be configured as a two-input gate. When twisted bit lines are utilized, the TWIST signal is input to the XOR gate 210. As will be appreciated, a person of ordinary skill in the art is capable of generating the TWIST signal to correspond to, and idenfify, when certain memory cells are accessed and to which bit lines they correspond.

As will be appreciated, the complement bit line BLC 102 may be utilized to drive the voltage driver circuit 130 instead of the true bit line BLT 104 (or the identifying numerals (BLT and BLC) can simply be switched in the FIGURES). Also, the transmission gates 214, 222 may alternatively be single transistor gates (controlled by PUMP or the PUMP complement).

It will be understood that the PUMP signal can be generated using a delayed version of the sense amplifier enable signal SA or generated from other clocking signals present in the memory array. Preferably, the PUMP signal is activated after the signal SA is activated and deactivated after the word line is deactivated. Alternatively, the PUMP signal may be deactivated after the SHORT ARRAY signal is activated (high), but this may cause additional power dissipation. One embodiment utilizes a delayed version of the signal SA. An alternative embodiment (not shown) utilizes the activation of the SHORT ARRAY signal to trigger the deactivation of the PUMP signal, or the deactivation/activation of some other timing signal to deactivate the PUMP signal at a time that is closely proximate the activation of the SHORT ARRAY signal. This provides the result that the voltage on the cell plate line 122 (i.e., the second plate 116 of the capacitor element 112) is substantially the same voltage (at substantially the same time) as an intermediate voltage (Vblp or Vdd/2) when the intermediate voltage level is present on the bit line BLT.

It will be understood that an additional voltage driver circuit 130 with the same operation and description, as shown in FIG. 2, is utilized for each additional column.

The general operation of the present invention is as follows: The bit line is equilibrated and pre-charged to an intermediate voltage. The word line is activated producing a small voltage differential across the true bit line and complement bit line (depending on the value stored in the active memory cell). The sense amplifier is enabled detecting the differential and generating a high logic voltage on the true bit line and a low logic voltage on the complement bit line, or vice versa, depending on the value stored in the active memory cell (read/refresh operation). As will be appreciated, the voltage values generated on the two bit lines will also depend on the logic value if the memory cell is being overwritten (write operation). Regardless of the logic voltage level (high or low) applied to the bit line of the active memory cell (being read/written), the complement logic voltage level (or substantially complement level) is applied to the cell plate line connected to the active memory cell. The word line is then deactivated storing the voltage present on the bit line to the capacitor (or charge-stoning device) of the memory cell. After the word line is deactivated, an intermediate voltage is applied to the cell plate line connected to the previously active memory cell. Application of the intermediate voltage provides a "pumping" effect to the voltage stored on the memory cell, thereby raising/lowering the voltage of the stored value to a higher/lower voltage level (storing high/low). Operation of the present invention results in an increased bit line voltage differential during the subsequent read of the memory, cell.

As will be appreciated, the intermediate voltage is a predetermined voltage level in the range between the logic high voltage level and the logic low voltage level. Preferably, the intermediate voltage-is substantially equal to Vblp (or Vdd/2).

Figure 3:
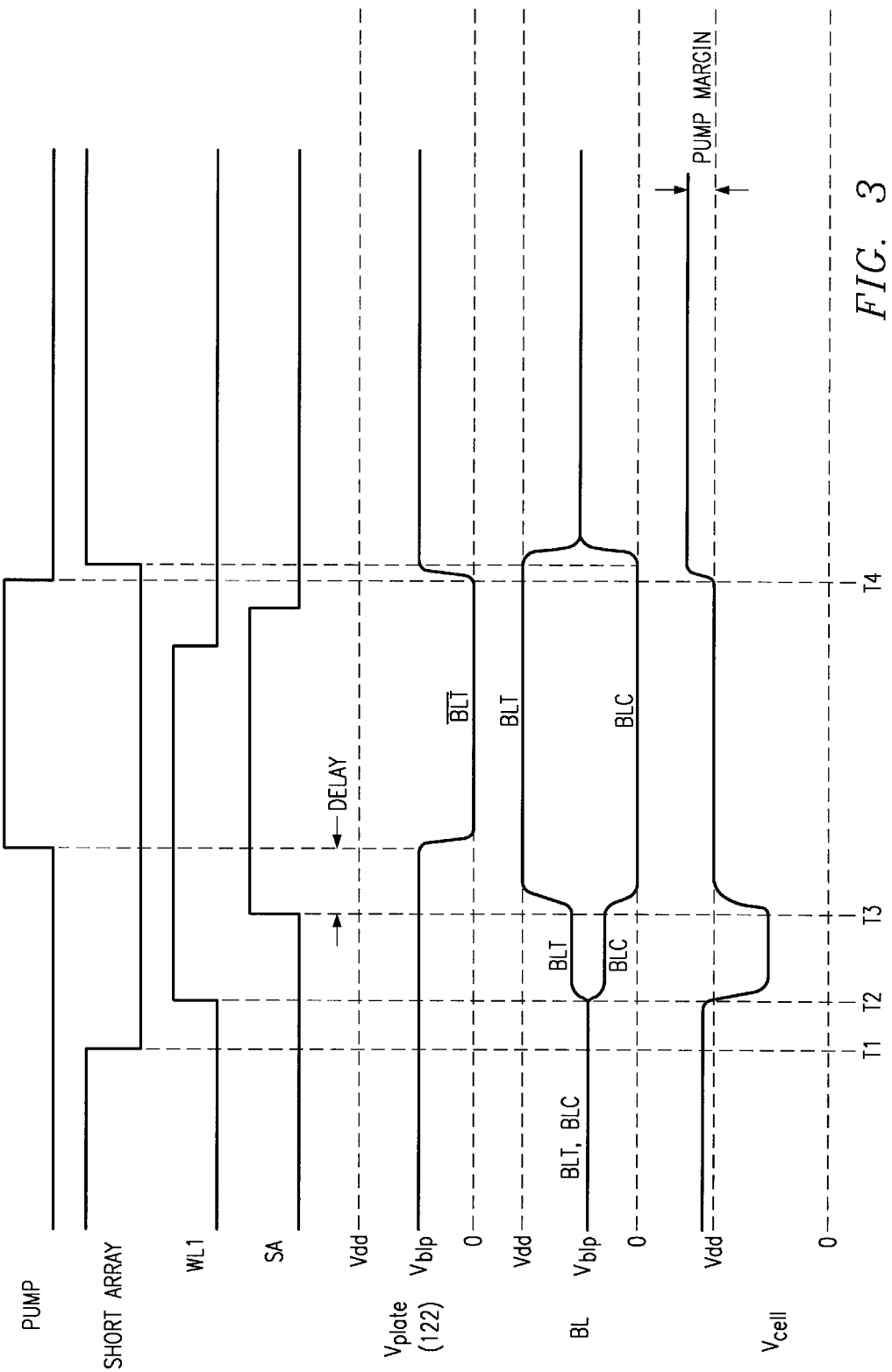
FIG. 3 is a timing diagram illustrating a read operation for a logic one stored in the memory cell.
Figure 4:
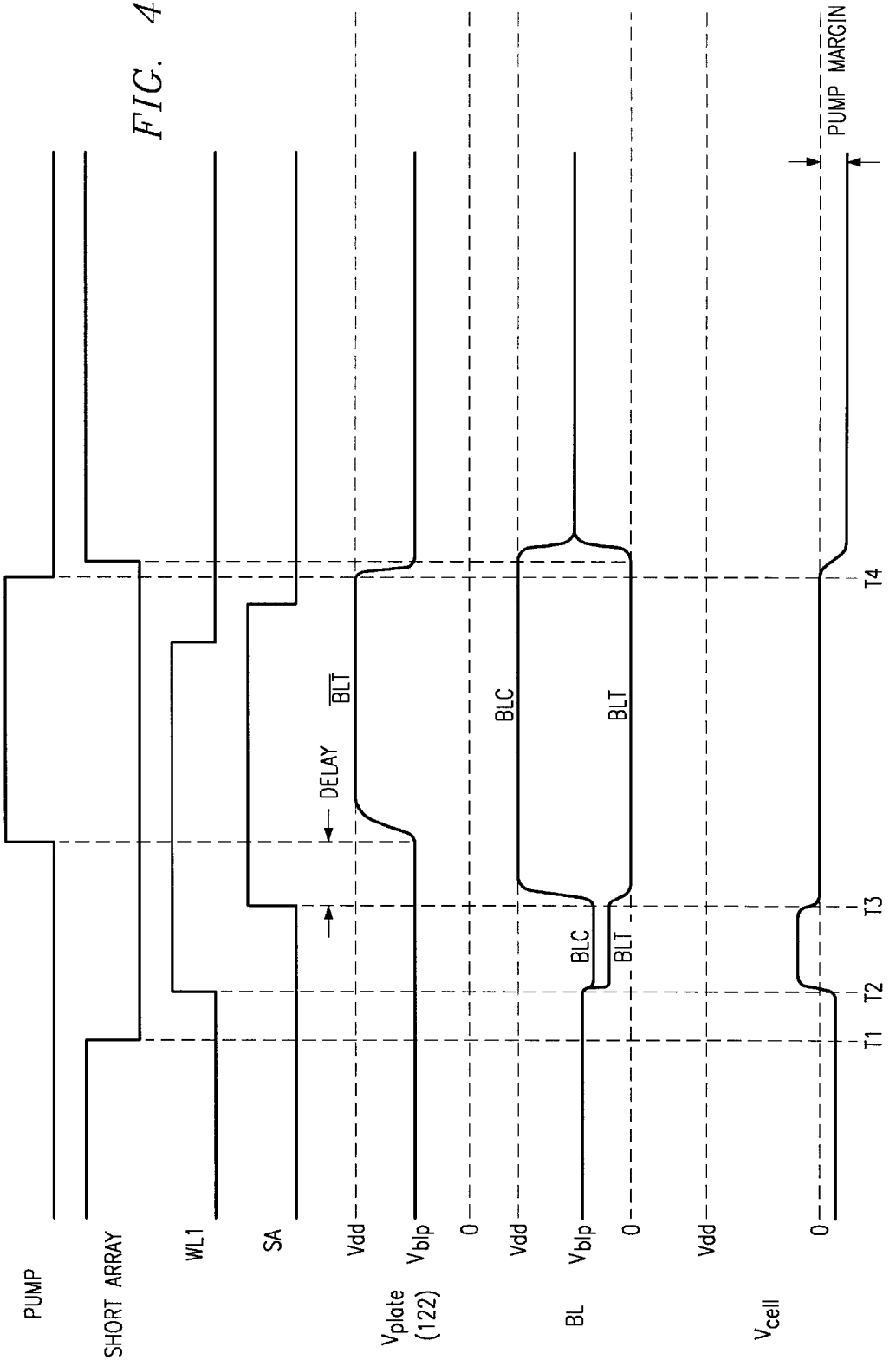
FIG. 4 is a timing diagram illustrating a read operation for a logic zero stored in the memory cell.

Now referring to FIGS. 3 and 4 (and with reference to FIG. 2), there are shown detailed timing diagrams illustrating a read operation for a logic one and a logic zero, respectively, stored in the memory cell associated with BLT 104.

The read operation (reading a logic one stored in the memory cell) shown in FIG. 3 generally begins at a time TI when the SHORT ARRAY signal is deactivated (low) resulting in the precharge and equilibration of the bit lines (BLT, BLC) to a voltage Vblp (intermediate voltage). As will be appreciated, the Vblp voltage is also applied to the cell plate line 122 of the active memory cell (shown as Vplate). At a time T2, the word line WL1 is activated turning on the access transistor 110 and coupling the capacitor (or charge-storing device) 112 to the bit line BLT 104. A dummy cell (not shown) is also activated coupling a voltage reference Vref (not shown, and preferably about Vdd/3) to the bit line BLC 102. A differential voltage is generated on the bit lines BLC 102 and BLT 104. At a time T3, the SA signal is activated. The activated sense amplifier 150 amplifies the differential voltage present on the bit lines BLC 102 and BLT 104 generating a logic high voltage on the BLT 104 and a logic low voltage on the BLC 102. After a predetermined delay (sufficient to allow the sense amplifier 150 to sense the bit lines and generate a logic high and logic low on the bit lines), a PUMP signal is activated which applies a logic low to the cell plate line 122. Because the voltage driver circuit couples the bit line BLT 104 (inverted) to the cell plate line 122 (Vplate), the voltage applied to the cell plate line 122 (Vplate) is a logic low voltage.

After the word line WL1 is deactivated, and generally after the read operation is completed (or substantially completed), at a time T4, the PUMP signal is deactivated resulting in application of the voltage Vblp (the intermediate voltage) to the cell plate line 122. Increasing the voltage of the cell plate line 122 from logic low to the intermediate voltage (after the memory cell is written logic high) provides the pumping mechanism that increases, or pumps, the voltage in the memory cell (see FIG. 3, identified as Vcell) to a value greater than the logic high voltage, providing the pump margin. The pumped voltage stored in the memory provides an increase in the voltage differential on the bit lines during a subsequent read operation of the memory cell.

Similarly, a read operation (reading a logic zero stored in the memory cell) shown in FIG. 4 is similar to the read operation in FIG. 3. After a predetermined delay the PUMP signal is activated which applies a logic high to the cell plate line 122. Because the voltage driver circuit 130 couples the bit line BLT 104 (inverted) to the cell plate line 122 (Vplate), the voltage applied to the cell plate line 122 (Vplate) is a logic high voltage.

After the word line WL1 is deactivated, and generally after the read operation is completed (or substantially completed), at a time T4, the PUMP signal is deactivated resulting in application of the voltage Vblp (the intermediate voltage) to the cell plate line 122. Decreasing the voltage of the cell plate line 122 from logic high to the intermediate voltage (after the memory cell is written logic low) provides the pumping mechanism that decreases, or pumps, the voltage in the memory cell (see FIG. 4, identified as Vcell) to a value less than the logic low voltage, providing the pump margin. The pumped voltage stored in the memory provides an increase in the voltage differential on the bit lines during a subsequent read operation of the memory cell.

The bit line input and the LSBWL input to the XOR gate 210 generate an output on the cell plate line 122 that is the complement logic level of the logic level on the bit line associated with the accessed memory cell. The optional TWIST input to the XOR gate can be utilized with twisted bit lines are present.

It will be understood that all the relevant active circuitry, or operating voltages, should be designed to provide correct operation with a pumped voltage (high or low) stored in the memory cell. This may include ensuring that the pumped down voltage stored in the memory cell is not lower than the back bias voltage minus Vt.

In general terms, the present invention provides a circuit and method of increasing the stored voltage (greater than a-logic one voltage level) in a memory cell by holding the memory cell plate 116 at a logic low during the writing of a logic one to the memory cell, and then raising the voltage at the memory cell plate 116 to an intermediate voltage after the word line is deactivated. Similarly, it decreases the stored voltage (less than a logic zero voltage level) in a memory cell by holding the memory cell plate 116 at a logic high during the writing of a logic zero to the memory cell, and then decreasing the voltage at the memory cell plate 116 to an intermediate voltage after the word line is deactivated. This results in increased differential voltages on the bit lines during a read operation of the memory cell.

Although the present invention and its advantages have been described in the foregoing detailed description and illustrated in the accompanying drawings, it will be understood by those skilled in the art that the invention is not limited to the embodiment(s) disclosed but is capable of numerous rearrangements, substitutions and modifications without departing from the spirit and scope of the invention as defined by the appended claims.

What is claimed is:

1. A memory, comprising:
    a first bit line;
    a first charge-storing element having a first plate and a second plate;
    a first access device having a first end, a second end and a control terminal, the first end coupled to the first bit line, the second end coupled to the first plate of the first charge-storing element and defining a node, and the control terminal coupled to a first word line;
    a second bit line;
    a second charge-storing element having a first plate and a second plate;
    a second access device having a first end, a second end and a control terminal, the first end coupled to the second bit line, the second end coupled to the first plate of the second charge-storing element and defining a node, and the control terminal coupled to a second word line;
    a voltage driver circuit having a first output terminal coupled to the second plates of the first and second charge-storing elements, and wherein the voltage driver circuit provides a high logic level voltage to the second plate of the first charge-storing element when a low logic level is present on a first bit line, a low logic level voltage to the second plate of the first charge-storing element when a high logic level voltage is present on a first bit line, and substantially the same voltage as an intermediate voltage to the second plate of the first charge-storing element when the intermediate voltage level is present on the first bit line.

2. The memory in accordance with claim 1 wherein the first and second charge-storing elements each comprises a capacitor.

3. The memory in accordance with claim 1 wherein the first bit line and the second bit line are true and complement bit lines configured as a column of memory.

4. The memory in accordance with claim 1 wherein the voltage driver circuit applies a high logic level voltage to the second plates of the first and second charge-storing elements for a predetermined period of time when either a low logic level voltage is read from or written to the first charge-storing element or a high logic level voltage is read from or written to the second charge-storing element, and applies a low logic level voltage to the second plates of the first and second charge-storing elements for a predetermined period of time when either a high logic level voltage is read from or written to the first charge-storing element or a low logic level voltage is read from or written to the second charge-storing element.

5. The memory in accordance with claim 4 wherein the voltage driver circuit comprises an XOR gate having a first input coupled to the first bit line and having a second input coupled to a signal LSBWL, and having an output coupled to the first and second plates of the first and second charge-storing elements; and wherein the signal LSBWL depends upon an address of a respective charge-storing element being accessed.

6. The memory in accordance with claim 5 wherein the XOR gate comprises a third input coupled to a signal TWIST, and wherein the TWIST signal depends upon the location of a respective charge-storing element being accessed in a twisted bit line architecture.

7. A memory, comprising:
    a first bit line (true);
    a first charge-storing element having a first plate and a second plate;
    an first access device having a first end, a second end and a control terminal, the first end coupled to the first bit line, the second end coupled to the first plate of the first charge-storing element and defining a first node, and the control terminal coupled to a first word line;
    a second bit line (complement);
    a second charge-storing element having a first plate and a second plate;
    an second access device having a first end, a second end and a control terminal, the first end coupled to the second bit line, the second end coupled to the first plate of the second charge-storing element and defining a second node, and the control terminal coupled to a second word line;
    a voltage driver circuit, having an first input terminal and an output terminal coupled to the second plates of the first and second charge-storing elements, for applying a first voltage to the second plates when either one of the first or second access devices is activated and a second voltage is applied to the first node, and for applying a third voltage to the second plates after the respective activated access device is deactivated.

8. The memory in accordance with claim 7 wherein the first and second charge-storing elements each comprises a capacitor.

9. The memory in accordance with claim 7 wherein the second voltage is greater than the first voltage and the third voltage is greater than the first voltage, and wherein the voltage stored on the first node is pumped to a magnitude greater than the second voltage.

10. The memory in accordance with claim 9 wherein the second voltage is a logic high value, the first voltage is a logic low value, and the third voltage is an intermediate value between the logic high and logic low values.

11. The memory in accordance with claim 7 wherein the second voltage is less than the first voltage and the third voltage is less than the first voltage, and wherein the voltage stored on the node is pumped to a magnitude less than the second voltage.

12. The memory in accordance with claim 7 wherein the input terminal of the voltage driver circuit is connected to the first bit line.

13. The memory in accordance with claim 12 wherein the voltage driver circuit comprises an XOR gate having the first input terminal coupled to the first bit line and having a second input terminal coupled to a signal LSBWL, and wherein the signal LSBWL signal LSBWL depends upon an address of a respective charge-storing element being accessed.

14. The memory in accordance with claim 12 wherein the voltage driver circuit comprises a second input terminal connected to the third voltage.

15. The memory in accordance with claim 14 wherein the voltage driver circuit couples the third voltage to the second plates of the charge-storing elements when a pump signal is in a first state and couples to the second plates of the charge-storing elements a voltage level substantially the same as either the first voltage or the second voltage depending on whether the first charge-storing element is being accessed or the second charge-storing element is being accessed.

16. A method of pumping a memory, comprising:
    activating a first word line for coupling a first plate of a first memory cell to a first bit line;
    activating a sense amplifier coupled to the first bit line and a second bit line for detecting a voltage differential between the first bit line and the second bit line;

applying a high logic voltage value to the first bit line and a low logic voltage value to the second bit line;

applying a first voltage to a second plate of the first memory cell and a second plate of a second memory cell, the second memory cell associated with the second bit line;

deactivating the first word line for decoupling the first plate of the first memory cell from the first bit line; and after the step of deactivating the first word line, applying a second voltage to the second plates of the first and second memory cells wherein the second voltage is greater than the first voltage.

17. The method in accordance with claim 16 wherein in the step of applying the first voltage to the second plate of the first memory cell, the first voltage is a low logic voltage value.

18. The method in accordance with claim 16 wherein the step of applying the first voltage to the second plate of the first memory cell is performed by a voltage driver circuit having a first input coupled to the first bit line.

19. The method in accordance with claim 16 further comprising:

activating a second word line for coupling a first plate of the second memory cell to the second bit line;

activating the sense amplifier coupled to the first bit line and the second bit line for detecting a voltage differential between the first bit line and the second bit line;

applying a high logic voltage value to the second bit line and a low logic voltage value to the first bit line;

applying a first voltage to the second plate of the second memory cell and the second plate of the first memory cell;

deactivating the second word line for decoupling the first plate of the second memory cell from the second bit line; and after the step of deactivating the second word line, applying a second voltage to the second plates of the first and second memory cells wherein the second voltage is greater than the first voltage.

20. The method in accordance with claim 19 wherein in the step of applying the first voltage to the second plate of the first memory cell, the first voltage is a low logic voltage value; and in the step of applying the first voltage to the second plate of the second memory cell, the first voltage is a low logic voltage value.

21. The method in accordance with claim 19 wherein the step of applying the first voltage to the second plate of the first memory cell and the step of applying the first voltage to the second plate of the second memory cell are both performed by a voltage driver circuit having a first input coupled to the first bit line.

22. A method of pumping a memory, comprising:

precharging and equilibrating a first bit line (true) and a second bit line (complement) to an intermediate voltage, the intermediate voltage having a magnitude between a first voltage and a second voltage representing a logic high and a logic low, respectively;

activating a first word line for coupling a first plate of a first memory cell to the first bit line;

activating a sense amplifier coupled to the first bit line and the second bit line;

applying the first voltage to the first bit line and the second voltage to the second bit line;

applying the second voltage to a second plate of the first memory cell and a second plate of a second memory cell, the second memory cell associated with the second bit line and a second word line;

deactivating the first word line for decoupling the first plate of the first memory cell from the first bit line; and after the step of deactivating the first word line, applying a third voltage to the second plates of the first and second memory cells, wherein the third voltage is substantially equal to the intermediate voltage.

23. The method in accordance with claim 22 wherein the steps of applying the second voltage to the second plate of the first memory cell and the second plate of a second memory cell and applying the third voltage to the second plates of the first and second memory cells is performed by a voltage driver circuit having a first input coupled to the first bit line.

* * * * *